United States Patent [19]

Rumsey et al.

[11] Patent Number: 5,105,373
[45] Date of Patent: Apr. 14, 1992

[54] METHOD OF SIMULATING THE OPERATION OF A CIRCUIT HAVING ANALOG AND DIGITAL CIRCUIT PARTS

[75] Inventors: Michael M. Rumsey; John N. Sackett, both of Bedford, England

[73] Assignee: Texas Instruments Incorporated, Dallas, Tex.

[21] Appl. No.: 468,384

[22] Filed: Jan. 22, 1990

[51] Int. Cl.$^5$ .......................... G06F 15/20; G06J 1/00
[52] U.S. Cl. ...................................... 364/578; 364/801
[58] Field of Search ............ 364/578, 801, 602, 221.1, 364/601, 600, 488, 489; 371/20.4, 23

[56] References Cited

U.S. PATENT DOCUMENTS 4,792,913 12/1988 Buckland et al. .................. 364/602
4,985,860 1/1991 Vlach ................................. 364/578

FOREIGN PATENT DOCUMENTS 0296812 12/1988 European Pat. Off. .

OTHER PUBLICATIONS

Chadka et al., "M(3)-A Multi-Level Mixed Mode Simulator", IEEE Conference 1988.
Sampson; "An Ideal Mixed-Mode Simulator", VLSI System Design 1988.
"Simulation Technique for Analog Functions in a Mixed Analog and Digital Semiconductor Chip Design Environment"; IBM Technical Disclosure; vol. 31, No. 7, 12/1988.
"Method for Mixed-Mode Simulation in a Hardware Logic"; IBM Technical Disclosure; vol. 30, No. 11, 4/1988.
O'Rourke; "Behavioral Modeling of Digital Devices in an Analog Simulation Environment"; VLSI, 1/1988.

*Primary Examiner*—Parshotam S. Lall
*Assistant Examiner*—Ellis B. Ramirez
*Attorney, Agent, or Firm*—William E. Hiller; Richard L. Donaldson

[57] ABSTRACT

The operation of analog circuit blocks is simulated on a digital computer by a computer program in which each analog circuit block is represented by a procedure call including details of input signal name(s) and value(s), output signal name(s) and value(s), the operating parameters for the block and the sampling instant for the evaluation of the or each output signal value. The interconnections between blocks are represented by the use of the same signal names. Each sampling instant indicates when the value of an output signal will have changed by a predetermined amount since the previous sampling instant. A common sampling time is used for the circuit and is selected as the earliest of the sampling instants of the circuit blocks. The simulation can include digital circuit blocks represented by an event-driven or a levelised compiled code model, with analog/digital conversion to handle the interconnections between analog and digital circuit blocks. A feedback connection around part of the analogue circuit is handled by progressive adjustment of the feedback input signal value while other input signal values are held constant.

13 Claims, 1 Drawing Sheet

METHOD OF SIMULATING THE OPERATION OF A CIRCUIT HAVING ANALOG AND DIGITAL CIRCUIT PARTS

The present invention relates to the simulation of the operation of a circuit having both analog circuit parts and digital circuit parts connected together.

When designing an electronic circuit it is common practice to simulate the operation of the circuit using a suitable computer program in order to ensure that the circuit when constructed will perform the required functions. At the highest level of the construction hierarchy of an electronic system are sub-systems, below which are functional building blocks, and finally at the lowest level there are individual components such as transistors, resistors and capacitors.

It is not practical to provide a simulator based on sub-systems because of the wide variety of sub-systems which could be used.

Simulators which simulate systems through analysis of the currents and voltages in the lowest level components are termed "circuit level" simulators. Although such simulators are usually quite accurate and can simulate both analog and digital circuit blocks, they operate very slowly so that a long period of time is required to obtain a full simulation of the behaviour of the overall system.

Another kind of simulator operates by utilising the behavioural descriptions of the functional building blocks, such as for example logic gates, operational amplifiers, filters, etc. When such a simulator is used to simulate the operation of digital circuits it is known as a "logic simulator" and uses digital logic values as the signals to provide the interaction between the blocks. Logic simulators cannot simulate the operation of analog circuits because of the continuously variable values nature of the signals to be fed from one circuit block to another. On the other hand, logic simulators can simulate the operation of digital circuits quite quickly and can readily be programmed to provide a reasonable simulation of a digital system in a relatively short period of time.

There are two common types of logic simulators; event-driven and levelised compiled code simulators. In an event-driven logic simulator, the response of a circuit is only evaluated when its inputs are changed, and the simulator must employ an event queue in order to maintain the changes at different parts of the circuit in step. The servicing of the event queue requires a lot of processing to be done by the computer, and consequently slows down the operation of the simulator. In a levelised compiled code logic simulator, the inputs to a circuit are set up and maintained at those values while each logic element is evaluated in the order of signal flow through the circuit. The sequential nature of the analysis makes evaluation much simpler and therefore faster than in the case of an event-driven simulator.

Enhancements of event-driven logic simulators have been proposed to enable them to cope with analog circuit blocks and these have relied upon the use of real numbers indicating the actual values of voltage signals at sampling instants in the operation of both analog and digital circuits. Such enhancements of logic simulators tend to slow down their operation so that a longer period of time is required to simulate the operation of digital circuits than is possible when only digital logic values are transmitted between the blocks.

It is an object of the present invention to enable the simulation of the operation of circuits composed of analog circuit blocks in which the disadvantages outlined above are substantially overcome.

According to the present invention there is provided a method of simulating by means of a digital computer the operation of a circuit composed of analog circuit blocks, the circuit being represented by a computer program in which each analog circuit block is represented by a procedure call including details of input signal name(s) and value(s), output signal name(s) and value(s), the operational parameters of the block and the sampling instant for the evaluation of each output signal value, each connection between the blocks is represented by the use of the same signal name for an output signal and an input signal, and real numbers are used to indicate the actual values of the input and output signals, each sampling instant for the evaluation of an output signal value being the time at which that value has changed by a predetermined amount since the previous sampling instant, wherein the values of the output signals from the procedure calls representing analog circuit blocks are evaluated at sampling times common to all the procedure calls, each common sampling time being selected as the earliest of the sampling instants provided by the procedure calls of all the analog circuit blocks included in the circuit.

The invention also includes apparatus for carrying out the method.

The simulation of the operation of a circuit composed of analog circuit blocks may be combined with a logic simulator of event-driven or levelised compiled code type modelling operation of a circuit composed of digital circuit blocks so as to provide a model of a circuit including an analog sub-system and a digital sub-system. The logic simulator may be a commercially available one, in which case the analog sub-system model will include an analog/digital interface to produce digital input signals for the logic simulator and to receive digital output signals from the logic simulator to represent the interconnections between the two sub-systems.

To provide the analog interface between an analog sub-system model and a digital sub-system model, the sub-system model may include at least one one-bit digital-to-analog converter responsive to a digital logic value received as an input from the digital sub-system model and/or at least one one-bit analog-to-digital converter responsive to an analog signal value to produce an output digital logic value transmitted to the digital sub-system model.

The analog sub-system model may be a levelised compiled code model. Because the signals occurring in analog are continuous functions of time and the digital computer requires numbers to process, it is necessary to sample the analog signals at discrete time points and process the values obtained. In a procedure call modelling an analog electrical circuit block the sampling instants are to be set when the change in an output signal of the block since the previous sampling instant is a predetermined voltage or current step. An example of a voltage step would be 1% of the maximum possible variation in the output signal voltage. Such a procedure for setting the sampling instant when applied to all the analog circuit blocks in the sub-system could give rise to several different sampling instants. Because the model of the analog sub-system is of the levelised compiled code type it is necessary to use the same sampling instants in all the analog circuit blocks in the sub-system and this is achieved by each time selecting the earliest sampling instant among all the analog circuit blocks in the sub-system and using that instant in all the analog circuit blocks. In that way the accuracy of the analog simulation is at least as good as that set by the user when he defined the voltage steps. In addition, the value of the output voltage of the block(s) at the sampling instant must be represented by a number which can be transmitted to the next block(s) in the circuit. Of course, the time scale in the analog circuit sub-system model will not, in general, correspond to real time but it must match the time scale used in the logic simulator for the digital circuit blocks.

The analog circuit sub-system may include a feedback path so that an input to part of the circuit is derived from an output of that part. The levelised compiled code simulation of the analog sub-system may be arranged to model the operation of the feedback path. The response of the circuit may be determined by a process of progressive adjustments of the fed back input resulting from taking into account the previous adjustment of that input, whilst any external inputs to the circuit are held constant. The adjustment is repeated a number of times until a stable fed back input and a stable output are obtained. While the adjustments are being calculated the signal values in parts outside the feedback loop, both analog and digital, do not change. Two or more unconnected feedback circuits can be processed at the same time.

Examples of the simulation of the operation of circuits will now be described with reference to the accompanying drawings, of which:

Figure 1:
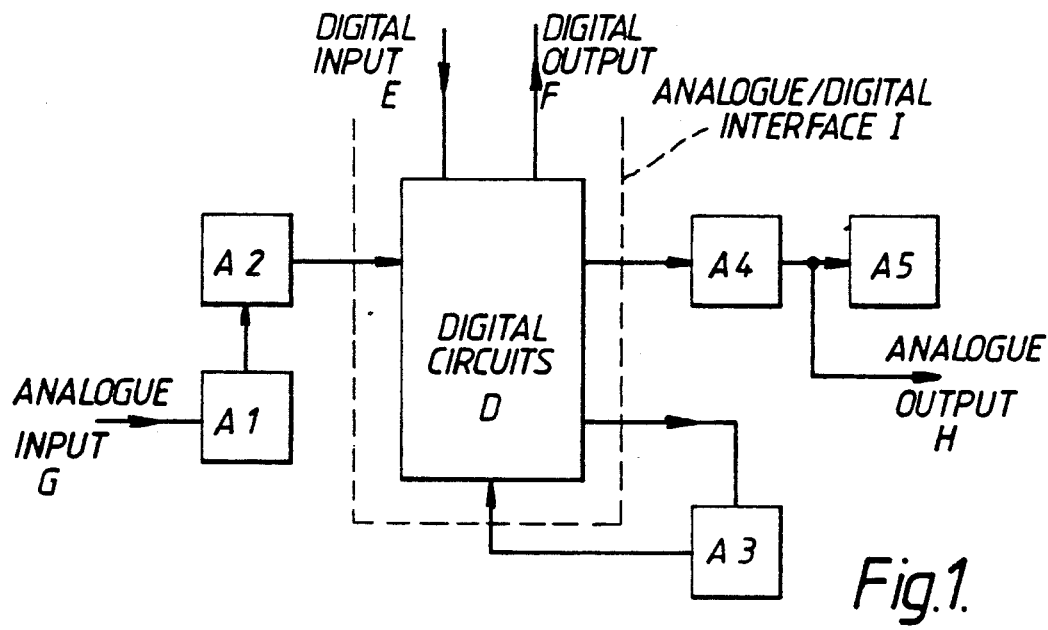
FIG. 1 is a block diagram of a circuit having analog and digital parts.

Let it be supposed that it is required to simulate the operation of a circuit including both an analog part and a digital part. The design of the circuit is entered into a computer in the form of cells respectively representing the functional blocks, both analog and digital, of the circuit. Each cell contains the name or source of the, or each, input signal to the particular block, the name or destination of the, or each, output signal from the particular block, and some representation of the signal processing properties of the particular block from which the value of the output signal(s) generated by the block in response to the input signal(s) can be derived.

When the model is operated, the externally originating signals which form the inputs, analog and/or digital, to the circuit are set to the required initial values, and are then changed in the same way as they would in the operation of the circuit itself. The input signals to the digital part of the circuit have digital logic values, such as "high" and "low" or "0" and "1". An input signal to the analog part of the circuit are samples taken from a continuous signal which is a continuous function of time at given sampling instants. The changes in the two types of input signal, analog and digital, must be kept in synchronism and may take place at a slower rate than real time to allow time for the model of the circuit to respond to the changes. On the other hand, if the processing speed of the computer is high enough or the digit rate of the digital input signals and the frequency content of the analog input signals are low enough, the model may operate on samples in real time.

The procedure calls representing blocks receiving the input signals from outside the circuit are processed by the computer to determine what output signals they will produce, and the resulting signals are applied as inputs to other procedure calls. The signals received by these other procedure calls are processed, resulting in other signals being generated and applied to further procedure calls, and so on. The processing of the procedure calls follows the various signal paths through the circuit with the final result that one or more output signals are generated. The computer is arranged to display the output signals to the user as the response of the model of the circuit to the input signals. The computer may also display the values of the intermediate signals to aid the understanding of the operation of the circuit model. Facilities may be provided for changing the parameters of some procedure calls representing circuit blocks so that the user can see the effect of changing component values or performance characteristics on the operation of the circuit.

The simulation program of the computer is divided into two distinct parts, a first part providing a model of the digital blocks in the circuit and a second part providing a model of the analog blocks in the circuit. The first part of the program, that providing the model of the digital blocks in the circuit, is a conventional logic simulator program. The second part of the program, that providing the model of the analog blocks in the circuit, not only handles the transmission of the signals between the analog blocks but it also provides the conversion of the analog signal values to digital logic values for signals which are applied to a digital block from an analog block, and the conversion of digital logic values to analog signal values for signals which are received by an analog block from a digital block. Typically, the analog to digital conversion will involve the production of a "1" if the analog voltage is above a threshold value and the production of a "0" if it is below that value. The digital to analog conversion may result in a first voltage (say, 5 volts) being produced in response to a "1" and a second voltage (say, 0 volts) being produced in response to a "0".

Although the input and output signals of the analog circuit blocks are usually measured in terms of voltage, there are forms of analog circuit system component where some other electrical or mechanical variable forms the input and/or output signal, such other forms of component can also be modelled by the procedure calls.

Referring now to FIG. 1 which shows a hypothetical circuit having digital circuits D and analog circuit blocks A1, A2, A3, A4 and A5. The blocks A2 and A3 are connected to apply input signals to the digital circuits D, and the blocks A3 and A4 are connected to receive input signals from the digital circuits D. The analog/digital interface is represented by the broken line I; this interface represents the conversion of analog signals to digital logic signals for signals which are being applied to the digital circuits D from the analog blocks A1–A5, and the conversion of digital logic signals to analog signals for signals received by the analog blocks A1–A5 from the digital circuits D. Digital logic input signals from an external source are applied to the digital circuits D along an input E. Digital logic output signals from the digital circuits D are applied to an external circuit along an output F. Analog signals in the form of sampled values are applied as inputs to the analog block A1 along an input G. Analog output signals from the analog block A4 appear on an output H, again in the form of sampled values.

When simulating the operation of the circuit shown in FIG. 1, the first part of the program, the logic simulator, provides a model of the digital circuits D and the second part of the program provides a model of the analog circuit blocks A1, ..., A5 as well as the analog/-digital interface I.

Of course, the program is not limited to simulating the operation of the circuit shown in FIG. 1, but can simulate the operation of any circuit.

An advantage of separating the analog circuit blocks from the digital ones in the simulation by providing separate simulation programs for the analog part and the digital part of the circuit is that it is necessary to transmit analog signal values only in the analog part, because the digital part need transmit only digital logic values.

Figure 2:
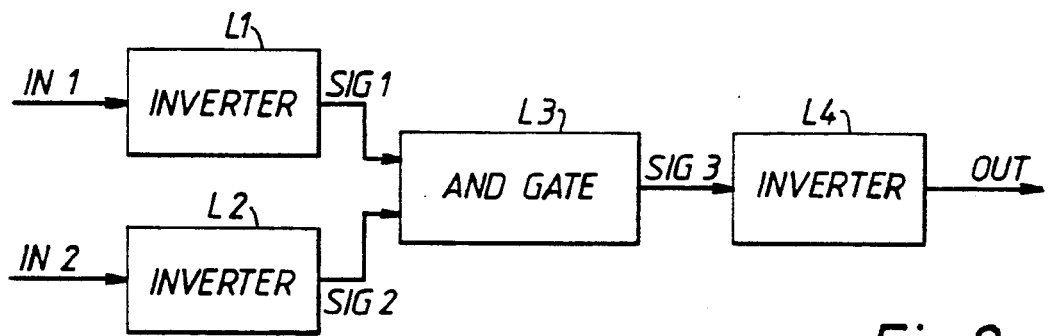
FIG. 2 is a block diagram of an example of a digital circuit.

FIG. 2 shows an example of a digital circuit having two inverters L1 and L2 to which input signals IN1 and IN2 are respectively applied. The outputs of the inverters L1 and L2 which are SIG1 and SIG2 respectively are applied to the inputs of an AND-gate L3. A further inverter L4 receives the output SIG3 of the AND-gate L3 to produce the output signal.

The input to the computer by the user specifies the circuit shown in FIG. 2 in terms of hardware description language as follows:

| Name | Block type | input/output signals |
| --- | --- | --- |
| L1: | Inverter | IN1, SIG1; |
| L2: | Inverter | IN2, SIG2; |
| L3: | AND-gate | SIG1, SIG2, SIG3; |
| L4: | Inverter | SIG3, OUT. |

In the program constructed by a levelised compiled code logic simulator the four procedure calls representing the four logical elements L1, L2, L3 and L4 are set out as follows:

| Procedure name (arguments) |
| --- |
| Inverter (IN1, SIG1); |
| Inverter (IN2, SIG2); |
| AND-gate (SIG1, SIG2, SIG3); |
| Inverter (SIG3, OUT). |

The logic simulator includes a library of logic elements including an inverter and an AND-gate and the information in the library includes the fact that an inverter has one input signal and one output signal, and the fact that an AND-gate has two input signals and one output signal.

It should be noted that the order of the procedure calls in the program is critical because the statements are executed sequentially and it is necessary for the values of SIG1 and SIG2 to be worked out before the output SIG3 of the AND-gate is derived from the values of SIG1 and SIG2. As mentioned above, the signals IN1, IN2, SIG1, SIG2, SIG3 and OUT can assume only logic values such as 0 and 1 or high and low.

Figure 3:
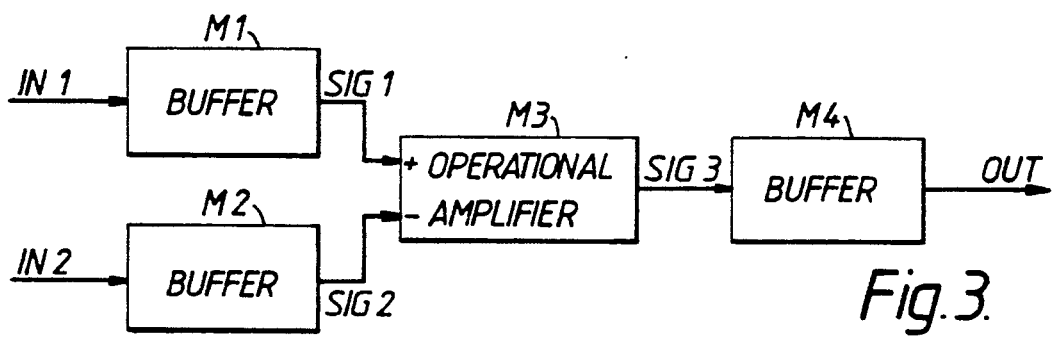
FIG. 3 is a block diagram of an example of an analog circuit.

FIG. 3 shows an example of an analog circuit having buffers M1 and M2 to which input signals IN1 and IN2 are respectively applied. The outputs of the buffers M1, M2, which are named SIG1 and SIG2, are applied to the non-inverting and inverting inputs respectively of an operational amplifier M3. The output signal of the operational amplifier M3 is named SIG3 and is applied through a buffer M4 to produce the output signal OUT.

In simulating the operation of this analog circuit the user would employ the second part of the program which would draw from a library of primitive circuits storing the different forms of analog circuit block, the procedure call forms for the four circuit elements M1, M2, M3 and M4,. The circuit shown in FIG. 3 may be specified as follows:

| Name | Block type | input/output signals |
| --- | --- | --- |
| M1: | Buffer | IN1, SIG1; |
| M2: | Buffer | IN2, SIG2; |
| M3: | OPAMP | SIG1, SIG2, SIG3; |
| M4: | Buffer | SIG3, OUT. |

Because the circuit elements in this instance are for handling analog signals and not digital ones, the library records the parameters that determine the performance of the circuit elements. In addition it is necessary for the program to provide a mechanism for handling circuit evaluation times. In the case of an event-driven model of a digital circuit the signals in the model are evaluated whenever one of the inputs of the circuit changes, this being possible because the change from one state to another of the input and output signals is assumed to be instantaneous. For an analog circuit model the program must determine the times of evaluation of the input and output signals because the values of these signals can be varying all the time and it is possible for an output value of a circuit to be varying even though the inputs to that circuit are constant.

The program determines the evaluation times by reference to a voltage step. This voltage step is an increment or decrement in the voltage concerned and may be an absolute value, such as, for example, 1 millivolt. The program provides an opportunity for the user to define a voltage step appropriate to each analog circuit element. The program calculates the future time, relative to the present time at which the specified voltage step will be reached in the output value of the circuit on the basis of the parameters specified for that circuit in the library. The future times for all of the circuit elements in the circuit are then compared and the earliest of these is selected by the program for use by all the circuit elements in the circuit. The interval between the present and future times is termed the "retrigger time" and can vary throughout the period of operation of the circuit. At the start of the program the value of the retrigger time is initially set at an arbitrarily high level, but after the program has worked through all of the circuit elements the retrigger time will have the value required by the element having the tightest timing requirement.

The resulting program, structure for the circuit shown in FIG. 3 is as follows:

| Procedure (arguments) |
| --- |
| Buffer (M1, IN1, SIG1, ... parameters ..., Max_voltage_step, retrigger_time); |
| Buffer (M2, IN2, SIG2, ... parameters ..., Max_voltage_step, retrigger_time); |
| OPAMP (M3, SIG1, SIG2, SIG3, ... parameters ..., Max_voltage_step, retrigger_time); |
| Buffer (M4, SIG3, OUT, ... parameters ..., |

| Procedure (arguments) |
| --- |
| Max_voltage_step, retrigger time). |

Comparison of that program structure with the structure produced for the digital circuit reveals the following differences. Each cell includes the reference number—M1, M2, etc., of the circuit element which is used as a pointer to memory locations where previous state values may be recorded for use in the modelling algorithms. The circuit parameters are not required for digital devices because the logical operation performed by any such device is determined by its name. In the case of analog circuit elements there could, for example, be operational amplifiers having different gains and different slew rates. A third difference is in the provision of the maximum voltage step and the retriggering time which are used as described above.

In addition to evaluating the outputs of the models at the instants determined by the retriggering time, the model is also evaluated when an input to the analog circuit as a whole is changed, for example, in response to a change in a digital logic signal applied to the analog sub-system. This means that each model of a circuit element must have the ability to evaluate its output at any time and not simply at the specified voltage steps.

As mentioned above, it is necessary to keep the changes in the analog part of the circuit in step with those in the digital part, which involves maintaining the correct relationship between the retriggering times and the clock times of the digital circuits.

At the interfaces between the analog circuits and the digital circuits, the program inserts one-bit analog-to-digital converters or digital-to-analog converters for carrying out the conversion between digital logic values and analog signal values.

Analog circuits, and hence the models representing them, sometimes contain feedback where the output of a block in a circuit is fed back to its own input or that of an earlier block in the circuit. In this situation it is impossible to work through the circuit from input to output to determine the signal levels at each block, but if the feedback loop is broken, it can be done, although there will remain a feedback signal which must be taken into account.

Figure 4:
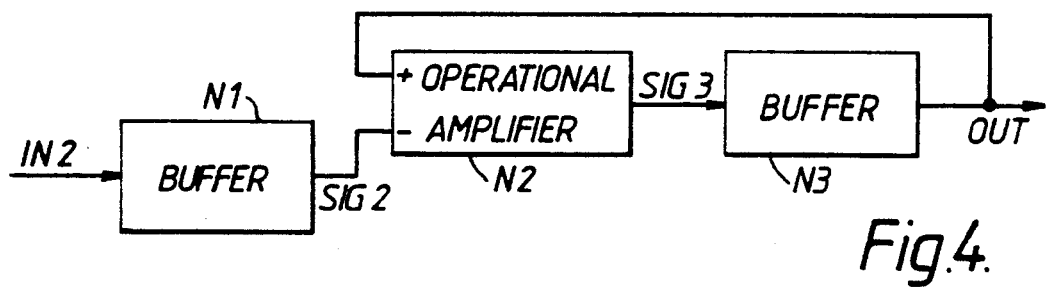
FIG. 4 is a block diagram of an example of an analog circuit including feedback.

FIG. 4 shows an example of a circuit with feedback. An input signal IN2 is applied as an input to a buffer N1, the output, SIG2, of which is applied to the non-inverting input of an operational amplifier N2. The output signal, SIG3, of the amplifier N2 is applied as the input to a buffer N3 the output of which forms the output signal OUT of the circuit. The signal OUT is also fed back to be applied to the inverting input of the amplifier N2.

The model program compiled by the simulators follows the principles outlined above with reference to FIG. 3 except that it contains a loop for calculating the feedback signal. The program to model that circuit is as follows:

```
iteration_number = 0;
retrigger_previous = retrigger;
REPEAT
    iteration_number = iteration_number + 1;
    feedback_OK = FALSE;
    retrigger = retrigger_previous;
    buffer (N1, IN2, SIG2, ... parameters ...,
```

```
        max_v_step, retrigger);
    op_amp (N2, SIG2, OUT, SIG3, ..., parameters ...,
        max_v_step, retrigger);
    buffer (N3, SIG3, OUT, ..., parameters ...,
        max_v_step, retrigger);
    feedback_procedure (estimate, OUT, iteration_
        number, feedback_OK);
UNTIL
    feedback_OK = TRUE;
    (swap master and working variables).
```

The second program provides a method of feedback management which may be summarised as follows. First some terminology will be clarified. The model is invoked at various instants, and following each instant a number of iterations round the feedback loop(s) are made to establish the correct value of the feedback signal(s). It is in this context that the terms "iteration" and "invocation" are used in the following description.

The program includes a procedure which is applied to a signal that is fed back. At each invocation this procedure estimates the value that the feedback signal should have at that instant. Several iterations are made of a program loop for evaluating the feedback signal. The iterations are terminated when the difference between the value of the feedback signal and an estimated value derived from previous values of the feedback signal becomes sufficiently small, for example, a predetermined fraction of the voltage step allocated to the circuit block.

Some circuit blocks require a memory of past state information, and these actually have two copies of that information. One is known as the master copy, and the other as the working copy. Upon each iteration the master copy of the past state information is copied into the working copy of the past state information, and it is the working copy that is used to calculate the model output. This procedure is followed so that each iteration within an invocation is calculated on the basis of correct past information—if this were not done then each iteration would update the past state information, which is required to be the past state at the previous retrigger time and therefore must be fixed until the next retrigger time. Once the last iteration is made the working copy of the information is what should be the master copy for the next retrigger time and so, after each invocation of the model, the pointers indicating the working and master copies are swapped over.

The two features mentioned above, the production of an estimate of the feedback signal and the use of working and master copies of the past state information, make possible the evaluation of feedback signals. There are two key elements in the first feature. First it is necessary to establish when the value of the feedback signal is sufficiently stable, and secondly when it is necessary to make a new calculation of the estimated value. These processes are performed as follows.

On the first iteration within an invocation the initial value used for the feedback signal is actually the value of that signal generated on the previous invocation. As that value was generated at an earlier time instant it is not correct for the present time instant. The output signals of the circuit blocks are evaluated and then the procedure for estimating the value of the feedback signal is called and the difference between the estimated value and the obtained value is measured. This difference is recorded as a criterion as to whether or not the feedback signal estimate is good enough; if the difference between estimated value and the obtained value on a subsequent iteration is smaller than a given fraction of the first difference (e.g. by a factor of 20), then the estimate is deemed good enough. The first difference is dependent on the voltage step size of the immediately preceding block, and what is required is to make sure that the error in estimating the feedback value is small relative to that voltage step size.

Upon completion of the first iteration the procedure for estimating the value of the feedback signal will modify that value in preparation for the second iteration. The latest estimated value is a small fraction of the way from the last estimated value towards the last obtained value. In a stable system, moving the estimated value towards the obtained value will always cause the next obtained value to move in the direction towards the estimated value. A small change only is made on the second iteration, in order that the sensitivity to changes in the estimated value of the obtained value can be measured on the next iteration.

After the second iteration the procedure for estimating the value of the feedback signal can evaluate that sensitivity, and can forecast the next estimated value based on that sensitivity in such a way that in a purely linear system the two values will coincide.

If, on the third iteration, it turns out that a linear estimate is not sufficiently accurate, a further algorithm is applied. This measures the present difference between the estimated value and the obtained value, and moves the estimated value by a small fraction of that difference (e.g. ⅛). If this fails the amount of movement is doubled on successive iterations. In the event of overshoot a small fraction of the last increment of the estimate is applied in the opposite direction. Essentially the algorithm applied is one of moving the estimate towards the obtained values in increasing jumps, until an overshoot occurs, in which case the search is taken back in the other direction with the jump size scaled down by a small fraction (for example, ⅛). The result (or consequence) is that searching for the correct estimated value is done to increasingly finer resolution. This is therefore inherently stable, and is flexible enough to permit several feedback signals to be modified at the same time.

In the case of analog circuit blocks having a relatively complicated transfer function, the parameters of the cell may include the transfer function in the form of a Laplace transform or a Z-transform, and the program may be arranged to calculate the output signal value from the current input signal value and stored previous signal values taking into account the time scale.

We claim:

1. A method of simulating the operation of a circuit comprising at least a plurality of analog circuit blocks having operational parameters by means of a digital computer, said method comprising:
   representing the circuit having a plurality of analog circuit blocks by a computer program;
   in the computer program, representing each of said plurality of analog circuit blocks by a procedure call,
   in the representation of each analog circuit block by a procedure call, including details of input signal names and values, and output signal names and values, the operational parameters of the analog block, and the sampling instant for evaluation of each output signal value,
   representing each connection between the analog circuit blocks by the use of the same signal name for an output signal and an input signal,
   providing real numbers to indicate the actual values of the input and output signals, and
   establishing each sampling instant for the evaluation of an output signal value as the time at which that value has changed by a predetermined amount since the previous sampling instant, or an earlier time at which the value of another output signal of the same analog circuit block has changed by the predetermined amount;
   selecting a sampling time common to all of the procedure calls as the earliest of the sampling instants provided by the procedure calls of all of the analog circuit blocks included in the circuit whose operation is being simulated; and
   evaluating the output signal values from the procedure calls representing each of said plurality of analog circuit blocks at the selected sampling time common to all of the procedure calls.

2. A method according to claim 1 wherein the predetermined amount is 1% of the maximum possible variation in the output signal value.

3. A method as set forth in claim 1, further including modeling the operation of a circuit comprising digital circuit blocks so as to provide a model of a circuit including an analog sub-system and a digital sub-system by a logic simulator of event-driven type;
   representing the interconnections between the analog sub-system and the digital sub-system by an analog/digital interface; and
   arranging the time scale of the digital sub-system to match the time scale of the analog sub-system.

4. A method as set forth in claim 3, further including converting at least one one-bit digital-to-analog conversion in response to a digital logic value from the digital sub-system; and/or
   converting at least one one-bit analog-to-digital conversion in response to an analog signal value from the analog sub-system.

5. A method as set forth in claim 1, further including modeling the operation of a circuit comprising digital circuit blocks so as to provide a model of a circuit including an analog sub-system and a digital sub-system by a logic simulator of levelised compiled code type;
   representing the interconnections between the analog sub-system and the digital sub-system by an analog/digital interface; and
   arranging the time scale of the digital sub-system to match the time scale of the analog sub-system.

6. A method as set forth in claim 5, further including converting at least one one-bit digital-to-analog conversion in response to a digital logic value from the digital sub-system; and/or
   converting at least one one-bit analog-to-digital conversion in response to an analog signal value from the analog sub-system.

7. A method as set forth in claim 1, wherein the circuit comprising at least a plurality of analog circuit blocks includes a feedback path in which an input signal to part of the circuit is derived from an output signal of that part, further including:
   progressively adjusting the feedback input signal conditioned upon previous adjustments of the feedback input signal while external input signals to the circuit are held constant; and repeating the adjustments to the feedback input signal until a stable feedback input signal and a stable output signal are obtained.

8. A method according to claim 7 including deriving an estimated value for the feedback input signal from the input signals applied to the circuit part before each of the progressive adjustments to the feedback input signal, and terminating the process of progressive adjustments to the fedback input signal when the difference between the value of the fedback input signal and the estimated value is less than a predetermined amount.

9. A method according to claim 8, wherein the predetermined amount is a predetermined fraction of a previous voltage step allocated to the circuit block.

10. A method as set forth in claim 8, further including storing the values of the internal states of the part of the circuit to which the fedback input signal is applied in duplicate as a master copy and a working copy;
   copying the working copy from the master copy at each adjustment of the fedback input signal;
   employing the working copy in calculating the output signal value of the circuit part; and
   updating the master copy at the common sampling times.

11. A method as set forth in claim 8, further including deriving the estimated value for the fedback input signal from the input signals applied to the circuit part by a first manner of derivation wherein small changes in the input signals are caused to occur;
   measuring the resulting changes in the fedback input signal;
   calculating a sensitivity factor relating the resulting changes to the causal changes; and
   deriving the estimated value for the fedback input signal from the input signals by employing the sensitivity factor on the assumption that the relationship is purely linear.

12. A method as set forth in claim 11, further including monitoring the adjustments of the fedback input signal;
   determining whether the condition for terminating the progressive adjustments to the fedback input signal may be satisfied within a few further additional adjustments; and
   changing to a second manner of deriving the estimated value for the fedback input signal based upon the difference between the value of the fedback input signal and the previous estimated value when the condition for terminating the progressive adjustments to the fedback input signal is not satisfied within the few further additional adjustments.

13. A method as set forth in claim 12, wherein the second manner of deriving the estimated value for the fedback input signal involves moving the estimated value toward the obtained value of the fedback input signal in increasing jumps until an overshoot occurs; and
   reducing the jumps in response to the occurrence of an overshoot to a fraction of the previous size and performed in the opposite direction.

* * * * *